(12) United States Patent
Takeuchi

(10) Patent No.: US 6,749,157 B2
(45) Date of Patent: Jun. 15, 2004

(54) SNAP STRUCTURE

(75) Inventor: Yasuichi Takeuchi, Tokyo (JP)

(73) Assignee: Takeuchi Industrial Co., Ltd., Tokyo (JP)

( * ) Notice: Subject to any disclaimer, the term of this patent is extended or adjusted under 35 U.S.C. 154(b) by 0 days.

(21) Appl. No.: 10/393,133

(22) Filed: Mar. 20, 2003

(65) Prior Publication Data

US 2003/0189140 A1 Oct. 9, 2003

(30) Foreign Application Priority Data

Mar. 22, 2002 (JP) ........................................ 2002-080527

(51) Int. Cl.[7] ............................................... F16B 15/00
(52) U.S. Cl. ................... 248/71; 24/16 PB; 248/74.3
(58) Field of Search ....................... 248/71, 74.2, 74.3, 248/74.1, 49, 65, 73; 24/16 PB, 17 AP

(56) References Cited

U.S. PATENT DOCUMENTS 4,669,688 A * 6/1987 Itoh et al. .................. 248/74.2
4,944,475 A * 7/1990 Ono et al. ..................... 248/71
5,131,613 A * 7/1992 Kamiya et al. ............. 248/74.3
5,601,261 A * 2/1997 Koike .......................... 248/71

FOREIGN PATENT DOCUMENTS

JP        2001278329 A    10/2001

* cited by examiner

*Primary Examiner*—Ramon O Ramirez
(74) *Attorney, Agent, or Firm*—Michael Best & Friedrich LLP

(57) ABSTRACT

A snap structure includes a post, arrowhead-shaped snap pieces, leg pieces, and disengaging pieces. The snap pieces are formed at a distal end of the post and elastically deformable in a radial direction. The leg pieces are arranged to oppose the snap pieces. The disengaging pieces are connected each to one end of corresponding one of the snap pieces that are enlarged in diameter, and can reduce in diameter the snap pieces manually. The snap pieces deform elastically in the radial direction, upon insertion in a through hole formed in a chassis or the like, and are fitted in the through hole, so as to clamp the chassis or the like together with the leg pieces. The post includes a stopper portion for prohibiting the post from being inclined in the through hole at not less than a predetermined angle.

2 Claims, 12 Drawing Sheets

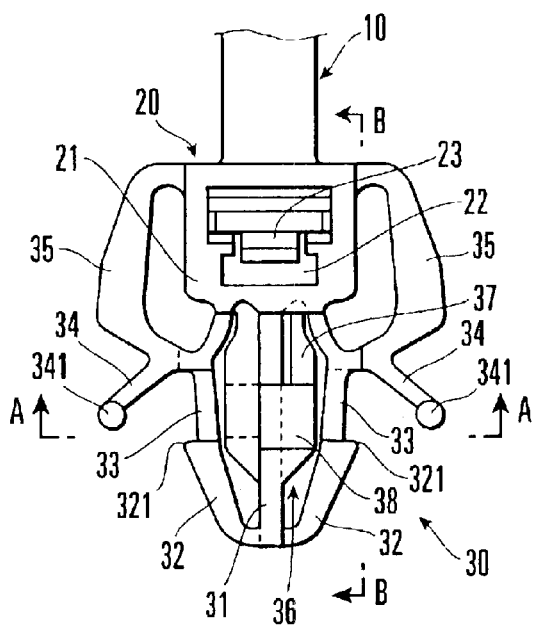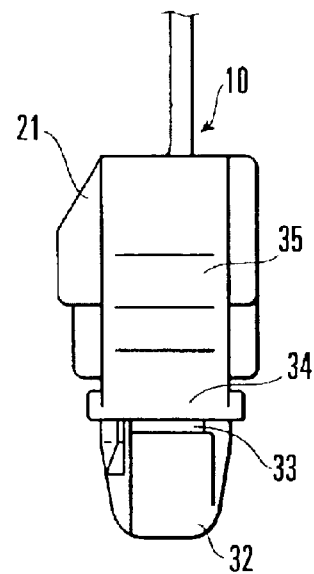
FIG.3A  FIG.3B
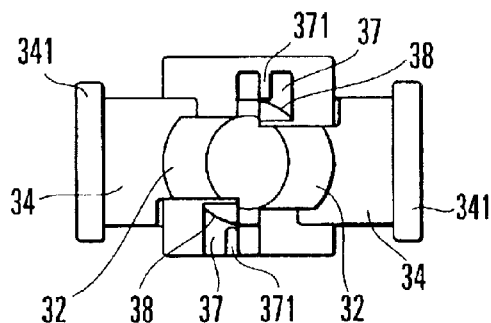
FIG.3C
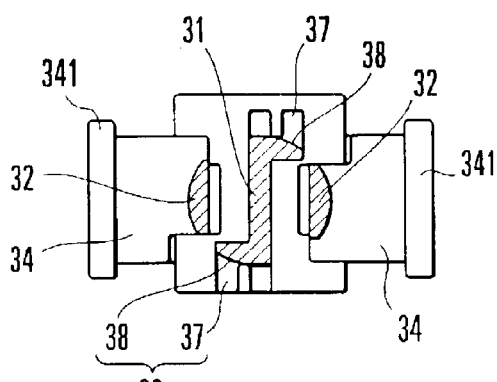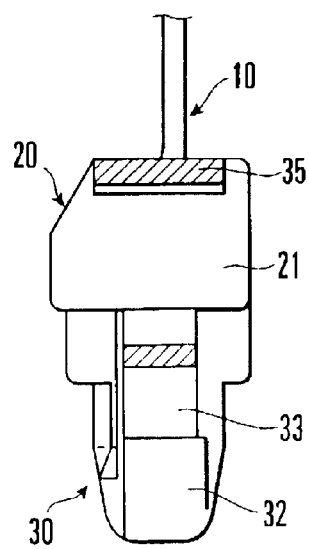
FIG.3D  FIG.3E

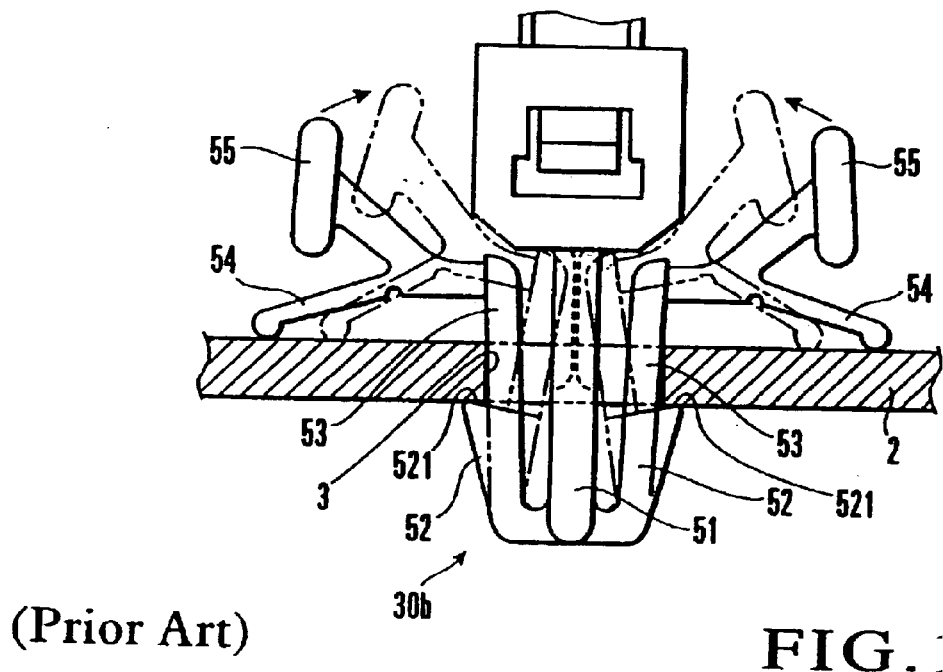
(Prior Art) FIG. 18A
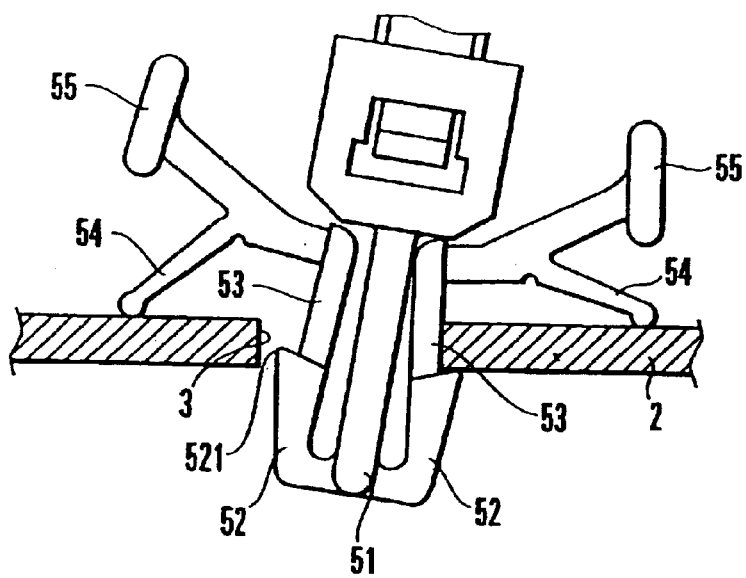
(Prior Art) FIG. 18B

SNAP STRUCTURE

BACKGROUND OF THE INVENTION

The present invention relates to a mount component such as a cable clamp which is used to mount an electronic component, a cable, or the like on a board of an electronic device or the like and, more particularly, to a snap structure for attaching a mount component on a board.

When assembling an electronic device, electronic components must be attached to an assembly board such as a panel, chassis, board, or the like (which will be referred to as a board hereinafter), and a coiring component such as a cable must be extended on the board. A mount component is used for this purpose. For example, when a cable is to be extended along the surface of a board, a cable clamp which holds a cable and attaches it to a chassis is used. Generally, a snap structure is employed as a structure for attaching a cable clamp to a chassis. FIG. 17 shows an example of the snap structure. A cable clamp 1D is constituted by a clamp portion 60 for holding a plurality of cables C in the form of a bundle, and a snap portion 30A formed integrally with the clamp portion 60 and to be fitted in a through hole 3 formed in a board 2. The cable clamp 1D is monolithically formed by resin molding or the like. In the clamp portion 60, a cover piece 62 is coupled at its one end to an upward U-shaped base 61 with a hinge, and its other end is locked by a locking portion 63. The cables C can be inserted or removed by opening or closing the cover piece 62. The snap portion 30A has a pair of snap pieces 52 extending like arrowheads on the two sides of a post 31 which projects downward. When the snap portion 30A is inserted in a through hole 3 from the upper surface of the board 2, the pair of snap pieces 52 are elastically reduced in diameter so they are inserted in the through hole 3. After passing through the through hole 3, the snap pieces 52 are elastically restored and enlarged in diameter, so that steps 521 formed at the distal ends of the snap pieces 52 engage with the inner edge of the through hole 3. A pair of leg pieces 34 which form an inverted V shape and oppose the snap pieces 52 abut against the upper surface of the board 2, so that engagement of the steps 521 and through hole 3 is held. This prevents the cable clamp 1D attached to the board 2 from disengaging from the through hole 3.

In recent years, regarding home electrical appliances, OA devices, automobiles, and electronic devices as a whole, the sale of environment-friendly products is obliged as a solution to the environmental issues. Along with this demand, for example, a printed board or wiring lines built in an electronic device must be able to be disassembled from the chassis, panel, or the like of the electronic device. Particularly, to facilitate the disassembling operation, the printed board or wiring lines must be disassembled easily without using any tools. For this reason, in assembly of an electronic device, a mount component of this type must be able to be attached to a through hole of a board easily. In disassembly of the electronic device, the mount component must be able to be removed easily from the through hole manually. A snap portion 30B shown in FIG. 18A as an example of such a snap structure is described in Japanese Patent Laid-Open No. 2001-278329 and is applied to a cable tie (to be described later). Arrowhead-shaped snap pieces 52 are formed on the two sides of the distal end of a straight plate-like post 51. The snap pieces 52 and connecting pieces 53 connected to the distal ends of the snap pieces 52 form steps 521. The connecting pieces 53 respectively integrally have disengaging pieces 55 that are directed outwardly and can be held with fingers. Leg pieces 54 project in the two sides from the disengaging pieces 55. In this snap structure, to disassemble from a through hole 3 the snap portion 30B fitted in the through hole 3, the disengaging pieces 55 are held with fingers from the two sides and are deformed inwardly, as indicated by alternate long and two short dashed lines in FIG. 18A. Interlocked with this, the snap pieces 52 reduced in diameter. The snap structure facilitates this reduction in diameter, and the snap pieces 52 can be easily disengaged from the through hole 3. This is effective as a solution to the environmental issues.

With this snap structure, if the disengaging pieces 55 and leg pieces 54 are designed to have a large elastic force, when the snap portion 30B is to be disengaged from the through hole 3, the force of the fingers to be applied to the disengaging pieces 55 can be reduced. However, the inward force increases due to the elastic force of the disengaging pieces 55 and leg pieces 54. Accordingly, the snap pieces 52 are biased in the diameter reducing direction, and the fitting force with respect to the through hole 3 decreases undesirably. If the disengaging pieces 55 and leg pieces 54 are designed to have a small elastic force, the support force of the leg pieces 54 decreases, and the post 51 can be inclined easily by an external force or the like. When the inclination of the post 51 becomes large as in FIG. 18B, one snap piece 52 deforms toward the post 51, and the other snap piece 52 moves into the open edge of the through hole 3 and disengages from the through hole 3. Then, the snap portion 30B undesirably drops from the through hole 3. As a result, the fitting force of the snap pieces is decreased by the diameter reduction of the snap pieces, making it difficult to obtain a stable, highly-reliable snap structure. This problem occurs not only in a cable clamp but also applies to all mount components that have similar snap structures.

SUMMARY OF THE INVENTION

It is an object of the present invention to provide a snap structure which allows a mount component to be attached to or removed from a board easily while preventing the mount component from undesirably disengaging from the board.

In order to achieve the above object, according to the present invention, there is provided a snap structure comprising a post, arrowhead-shaped snap pieces formed at a distal end of the post and elastically deformable in a radial direction, leg pieces arranged to oppose the snap pieces, and disengaging pieces which are connected each to one end of corresponding one of the snap pieces that are enlarged in diameter and which are capable of reducing in diameter the snap pieces manually, the snap pieces serving to deform elastically in the radial direction, upon insertion in a through hole formed in a chassis, to be fitted in the through hole, so as to clamp the chassis together with the leg pieces, wherein the post comprises a stopper portion for prohibiting the post from being inclined in the through hole at not less than a predetermined angle.

BRIEF DESCRIPTION OF THE DRAWINGS

FIGS. 3A to 3E are an enlarged front view, right-side view, bottom view, sectional view taken along the line A—A, and sectional view taken along the line B—B, respectively, of the main part of the cable tie of FIG. 1;

FIGS. 18A and 18B are front views showing another conventional snap structure to explain its problem.

DESCRIPTION OF THE PREFERRED EMBODIMENTS

Figure 1:
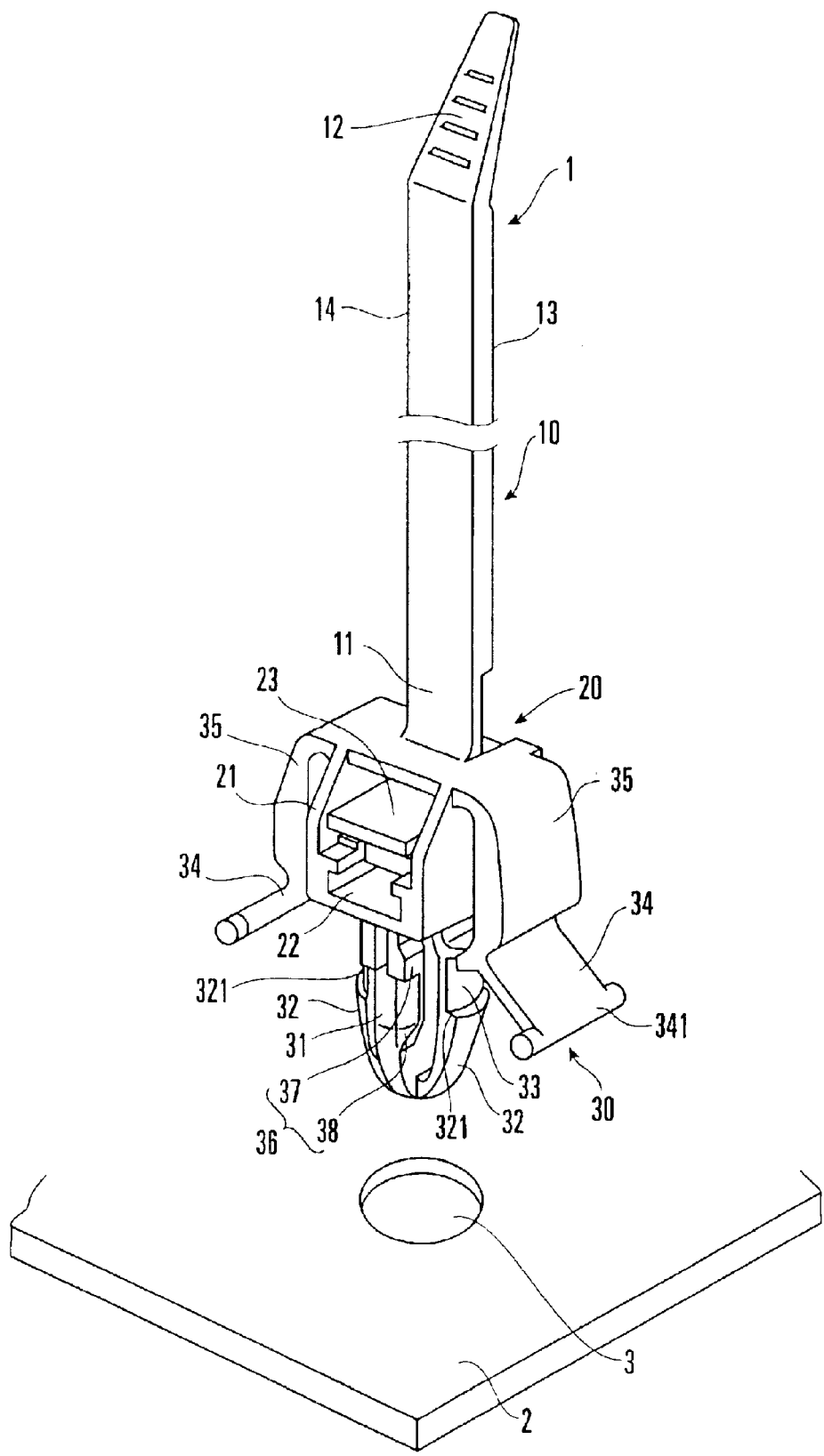
FIG. 1 is a perspective view of the first embodiment in which the present invention is applied to a cable tie.
Figure 2A:
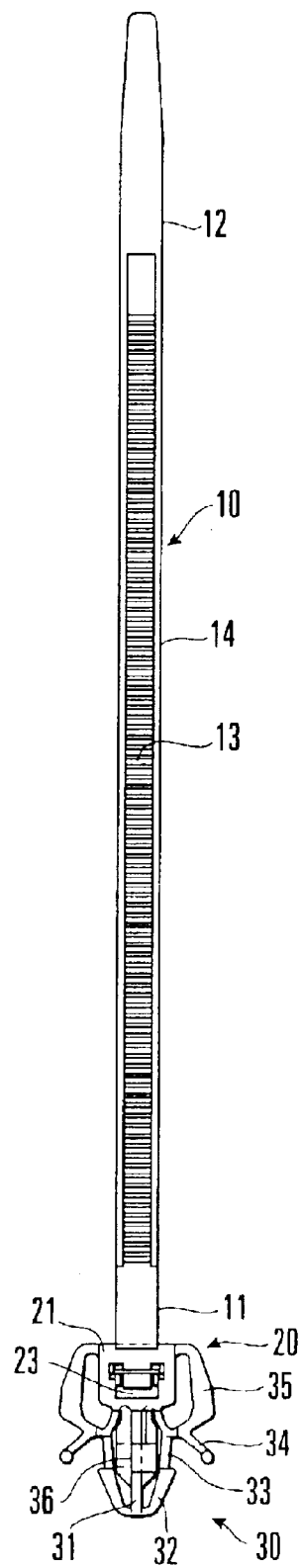
FIGS. 2A and 2B are overall front views of the cable tie of FIG. 1.
Figure 2B:
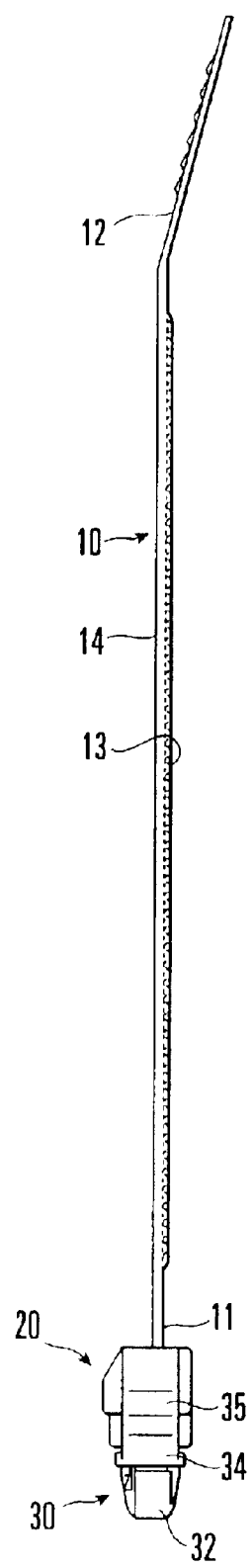

The embodiments of the present invention will be described with reference to the accompanying drawings. FIGS. 1 to 3E show the first embodiment in which the snap structure of the present invention is applied to a cable tie. Referring to FIGS. 1 to 3E, a cable tie 1 according to this embodiment is constituted by a belt portion 10 for clamping cables (not shown) by winding and fastening, a locking portion 20 for locking the belt portion 10 in a state of winding and fastening the cables, and a snap portion 30 formed on the lower or side portion of the locking portion 20. The belt portion 10, locking portion 20, and snap portion 30 are integrally formed by resin molding. The cable tie 1 is to be attached, by fitting, to a through hole 3 formed in a chassis 2.

The structures of the belt portion 10 and locking portion 20 are widely known, and will be described briefly. A proximal end 11 of the belt portion 10 forms a belt having a required width and length and connected to the locking portion 20. A distal end 12 of the belt portion 10 has a gradually decreasing width so that it can be inserted in a locking portion (to be described later) easily. One side surface of an intermediate portion 14 in the longitudinal direction of the belt portion 10 has a saw-toothed portion 13 over a required region in the longitudinal direction. The locking portion 20 has a rectangular cylindrical portion 21. An insertion groove 22 through which the distal end 12 and intermediate portion 14 of the belt portion 10 can be inserted is formed in the cylindrical portion 21. A tongue-shaped locking piece 23 engageable with the saw-toothed portion 13 of the belt portion 10 is formed in and supported by the insertion groove 22. Hence, when the belt portion 10 is inserted in the insertion groove 22 of the locking portion 20 from its distal end 12 while bending it around the outer surfaces of cables (not shown), so the locking piece 23 and saw-toothed portion 13 engage with each other, disengagement of the belt portion 10 from the insertion groove 22 is prevented, and the cables are held wounded and fastened.

The snap portion 30 has the elongated plate-like post 31 projecting vertically downward from the lower surface of the locking portion 20, a pair of arrowhead-shaped snap pieces 32 extending from the right and left surfaces of the distal end of the post 31 outwardly and obliquely upward and having horizontal sections that form arcs about the post 31 as the center, a pair of connecting pieces 33 for connecting the upper ends of the snap pieces 32 and the lower surface of the locking portion 20, a pair of leg pieces 34 projecting straightly and outwardly downward from the outer surfaces of the connecting pieces 33, and a pair of disengaging pieces 35 extending from the outer surfaces of the connecting pieces 33 to bulge outwardly up to the upper edge of the locking portion 20.

The post 31 has, in its region extending from a portion immediately under the locking portion 20 and portions slightly under the lower ends of the connecting pieces 33, stopper portions 36 projecting in opposite directions along the two sides of the post 31. Almost upper half of each stopper portion 36 is thick to form an abutting portion 37, and its outer surface has a relief groove 371 to avoid sink marks in resin molding. The lower half of the stopper portion 36 forms an impact abutting portion 38 with a horizontal section that forms a semi-arcuate outer shape conforming to the circumference about the center position of the post 31 as the center. This semi-arc is close to a circumference almost concentric with the arc of the horizontal section of each snap piece 32, as shown in FIG. 3D, and forms a circumference with a diameter slightly smaller than the diameter of the through hole 3 formed in the board 2. The impact abutting portions 38 are formed in such a region that they will not interfere with the snap pieces 32 when the snap pieces 32 elastically deform toward the post 31 to reduce their outer diameter.

The snap pieces 32 have arrowhead-like shapes in which their widths gradually increase toward their upper ends, in the same manner as in the snap pieces of a conventional snap portion. The upper ends of the snap pieces 32 are formed thicker than the connecting pieces 33 connected to them, thus forming steps 321, corresponding to the thickness difference from the connecting pieces 33, on the outer sides of the upper ends of the snap pieces 32. The distal ends of the pair of leg pieces 34 are located at two outer sides of the snap pieces 32. These distal ends have circular rod-like abutting ends 341 which are to abut against the upper surface of the chassis 2. The disengaging pieces 35 moderately extend in the two outer directions such that they bulge gradually from their upper ends to lower ends on the two outer sides of the two side surfaces of the locking portion 20. Particularly, the lower ends of the disengaging pieces 35 are connected almost perpendicularly to the outer side surfaces of the connecting pieces 33.

Figure 4A:
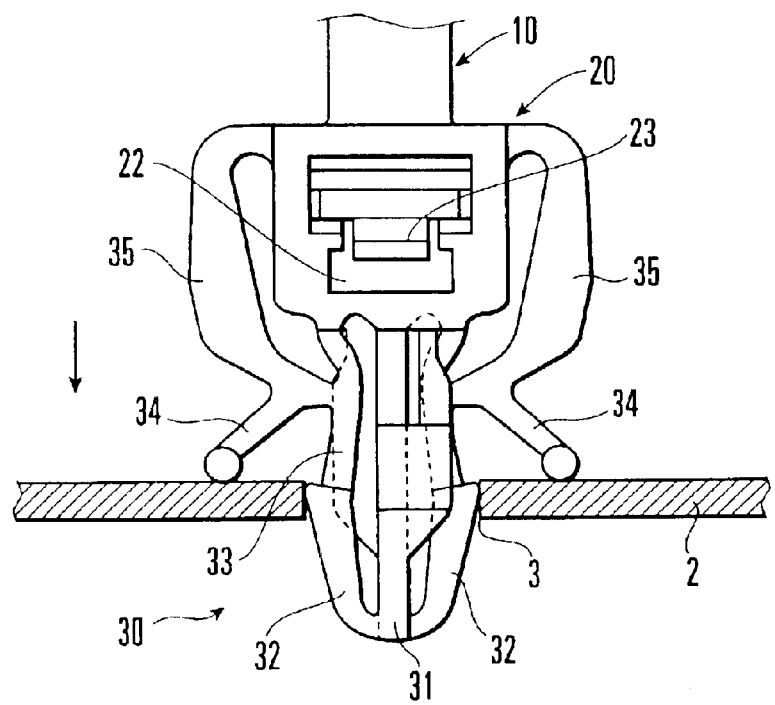
FIGS. 4A and 4B are views for explaining the mounting operation of the first embodiment.
Figure 4B:
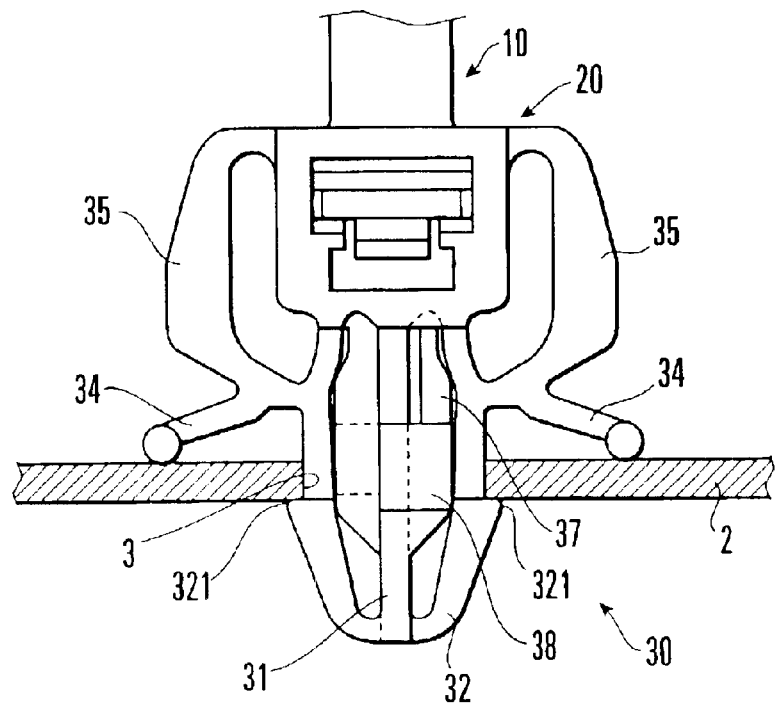

With the cable tie 1 having the above arrangement, when the cable tie 1 is to be attached to the through hole 3 in the chassis 2, the operator holds the cable tie 1 with his fingers and inserts its snap pieces 32 in the through hole 3 from the upper surface of the chassis 2, as shown in FIG. 4A. When the snap pieces 32 are inserted in this manner, they elastically deform to be reduced in diameter, so that they can be inserted in the through hole 3. At this time, since the disengaging pieces 35 are deformed inwardly by the fingers, diameter reduction of the snap pieces 32 is aided through the connecting pieces 33, so that the snap pieces 32 can be inserted easily. When the snap pieces 32 are reduced in diameter inwardly, they will not interfere with the stopper portions 36 formed on the post 31. When the snap pieces 32 run through the through hole 3 as shown in FIG. 4B, they are restored by their elastic force and enlarge in diameter outwardly, and their steps 321 engage with the inner edge of the through hole 3 on the lower surface side of the chassis 2. As the leg pieces 34 abut against the upper surface of the chassis 2 due to their elastic force, the entire snap portion 30 is held fitted in the through hole 3, and is prevented from dropping by engagement of the steps 321 and the inner edge of the through hole 3. When the cable tie 1 is attached, the impact abutting portions 38 at the lower halves of the stopper portions 36 formed on the post 31 have entered the through hole 3, and the abutting portions 37 at the upper halves are in contact with or close to the upper surface of the chassis 2.

Figure 5:
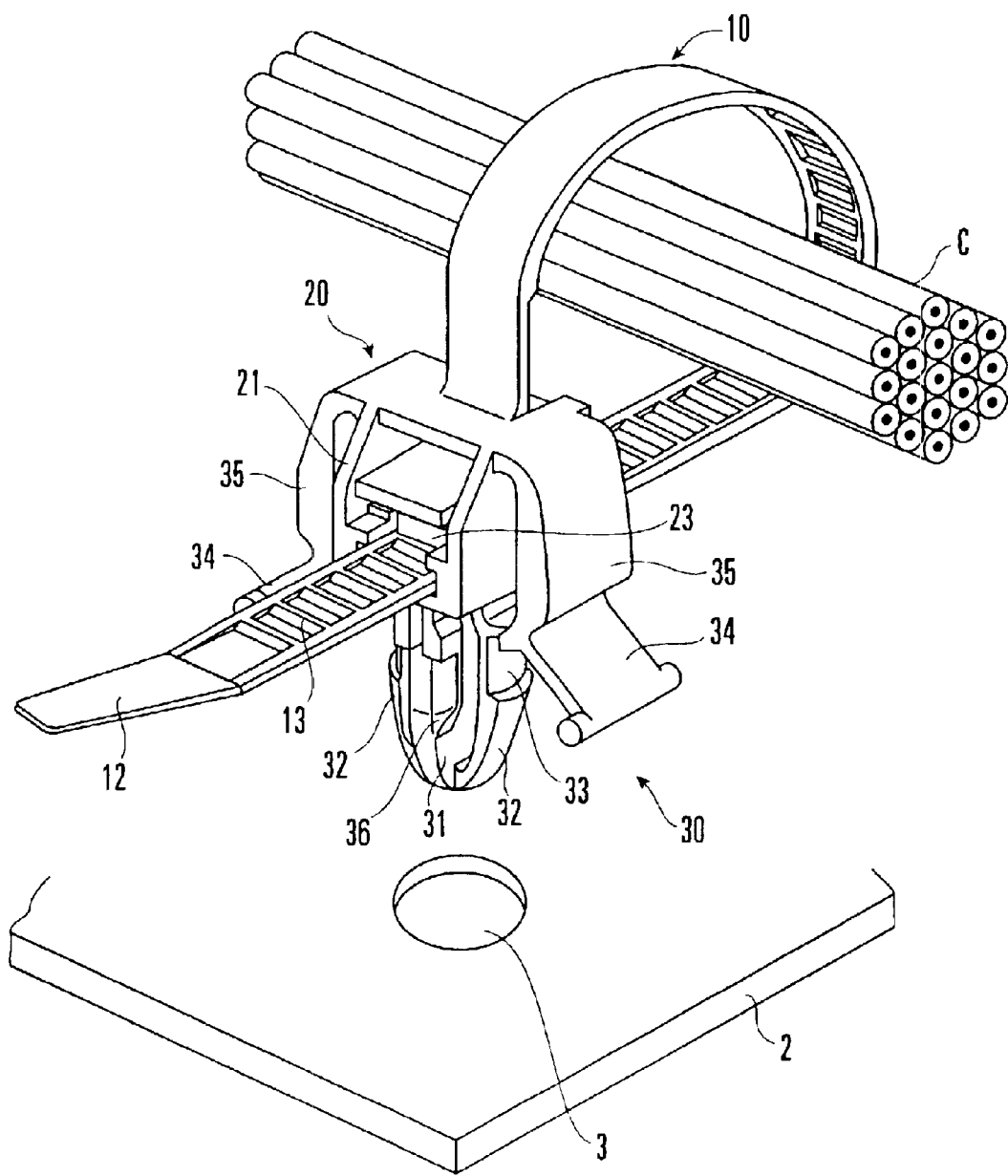
FIG. 5 is a perspective view showing another mounting state.

In this state, the belt portion 10 is wound around the cables which are to extend on the upper surface of the chassis 2. The distal end 12 of the belt portion 10 is inserted in the insertion groove 22 of the locking portion 20, and the locking piece 23 and saw-toothed portion 13 are engaged with each other. Thus, disengagement of the belt portion 10 in a direction opposite to the inserting direction is locked, and the belt portion 10 keeps winding and fastening the cables. Therefore, the cables are held on the upper surface of the chassis 2 by the cable tie 1. As shown in FIG. 5, the operation of winding and fastening the cables C with the belt portion 10 may be performed before attaching the cable tie 1 to the chassis 2. After that, the snap portion 30 may be inserted in the through hole 3 and be fitted and attached to it.

Figure 6:
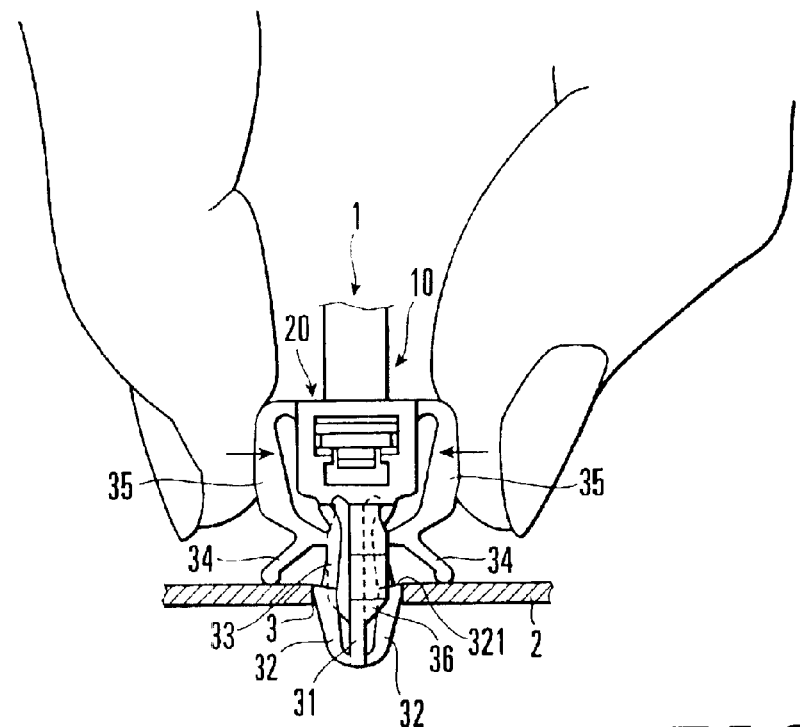
FIG. 6 is a view for explaining the operation of disengaging the cable tie.

To disengage from the chassis 2 the cable tie 1 attached to the chassis 2, as shown in FIG. 6, the disengaging pieces 35 are held with the two fingers from the outer side, and are deformed inwardly by applying a force from the two sides. This deforming force is transmitted to the connecting pieces 33 to deform them inwardly. Hence, the snap pieces 32 integral with the connecting pieces 33 are also deformed inwardly and are reduced in diameter, and the steps 321 disengage from the inner edge of the through hole 3. The snap portion 30 can be removed from the through hole 3 by pulling the cable tie 1 upward from the chassis 2, so that the cable tie 1 can be attached and removed easily.

Figure 7:
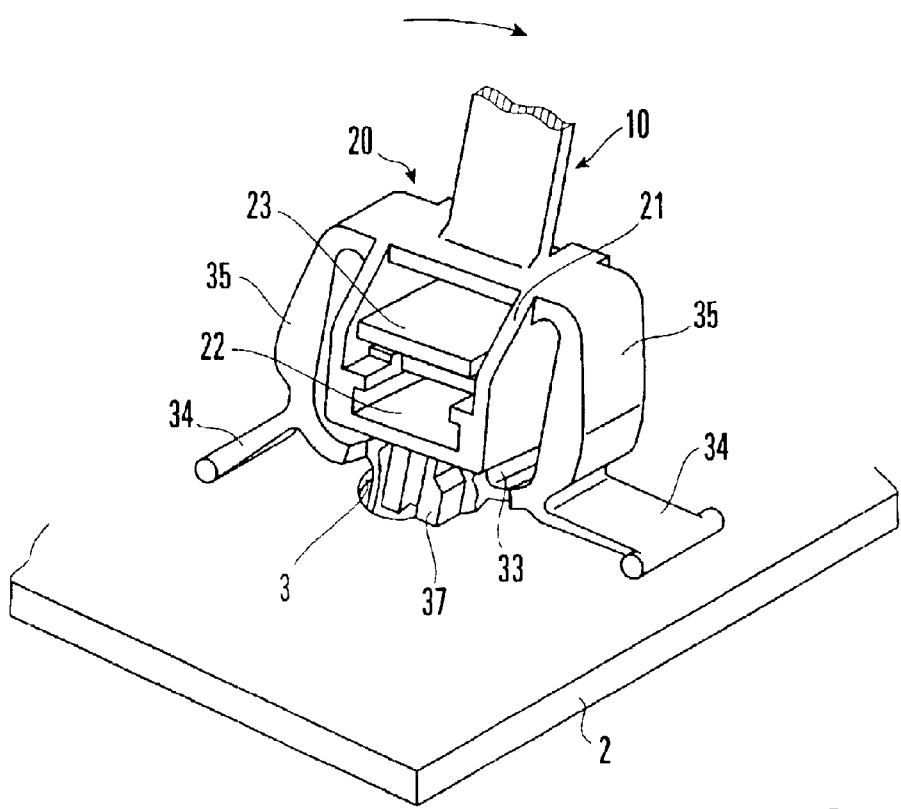
FIG. 7 is a perspective view showing a state in which the cable tie is inclined.
Figure 8A:
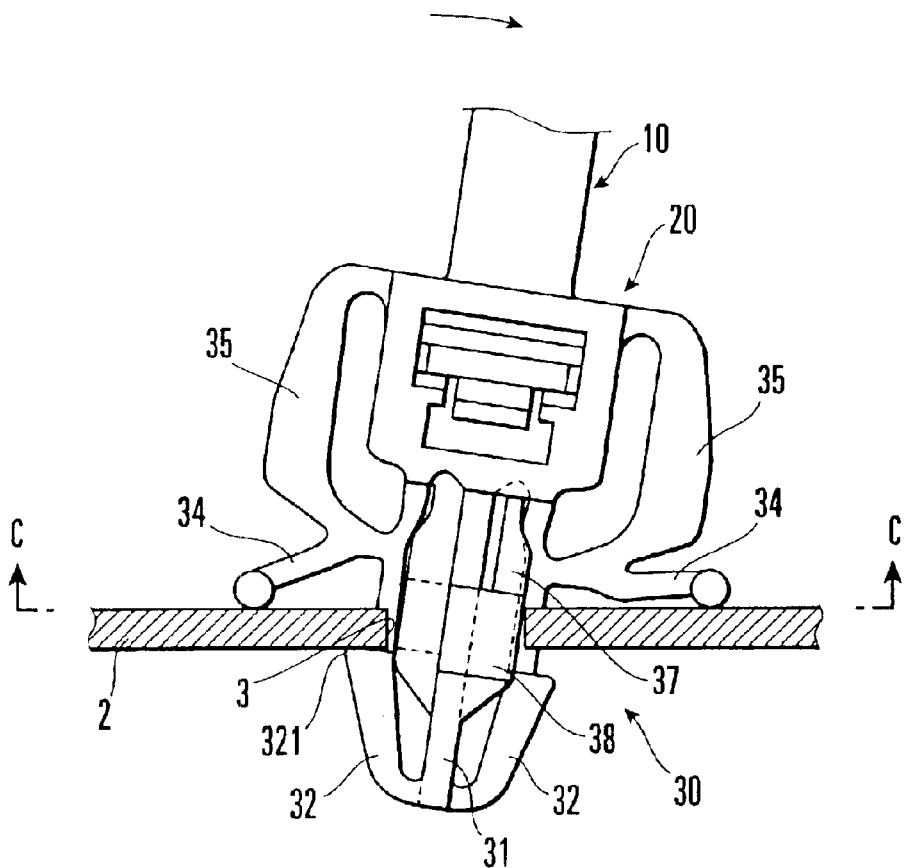
FIGS. 8A and 8B are a front view and a sectional view taken along the line C—C, respectively, for explaining an effect of preventing disengagement caused by inclination.
Figure 8B:
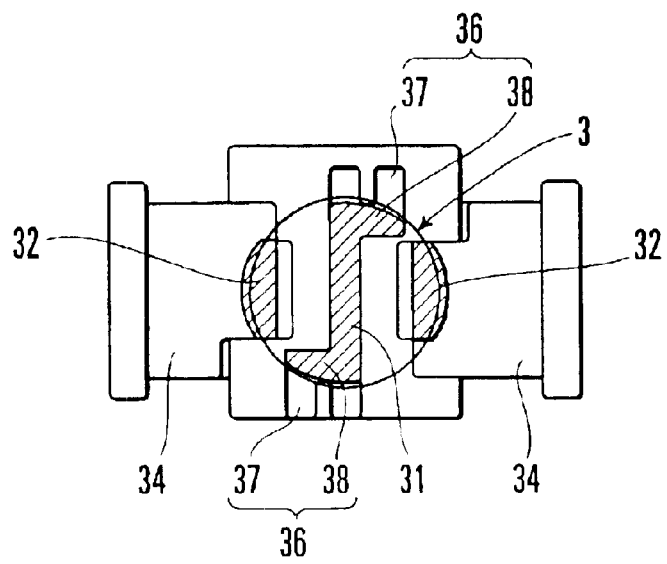

With the cable tie 1, while it is attached to the chassis 2 as shown in FIG. 7, when, e.g., an external force for moving the cables is applied to it, the entire cable tie 1 is to incline with respect to the chassis 2. When the post 31 of the snap portion 30 is inclined along a vertical plane where the pair of snap pieces 32 are present, one snap piece 32 deforms largely toward the post 31, and the other snap piece 32 may disengage from the through hole 3 and remove from it, in the same manner as that shown in FIG. 18B. With the cable tie 1 of this embodiment, however, after the snap portion 30 starts to incline, when it is inclined at only a small angle, the outer surfaces of the impact abutting portions 38 of the stopper portions 36 on the two sides of the post 31 inevitably abut with impact against the inner edge of the through hole 3 as indicated by the front view of FIG. 8A and the sectional view of FIG. 8B taken along the line C—C conforming to the chassis surface. Simultaneously, the abutting portions 37 immediately above the impact abutting portions 38 abut against the upper surface of the chassis 2 at the open edge of the through hole 3. When the stopper portions 36 abut against the through hole 3 and chassis 2, the post 31 is prohibited from inclining any further, and the snap pieces 32 are prevented from deforming inwardly. Therefore, the snap portion 30 will not be disengaged from the through hole 3.

From the above fact, with the cable tie 1 of this embodiment, the operation of attaching the cable tie 1 to the through hole 3 of the chassis 2 and the operation of disengaging this mount component can be performed easily. This facilitates the operation of disassembling the printed board or wiring lines of an electrical appliance from the chassis or panel as a solution to the environmental issues. The attached cable tie will not disengage from the chassis 2 easily. Thus, the reliability with which the cables are held by the cable tie can be improved.

With this cable tie 1, when the post 31 is inclined toward an elevation plane perpendicular to the elevation plane including the pair of snap pieces 32, the snap pieces 32 will not be reduced in diameter, so that the snap portion 30 will not disengage from the through hole 3. In this case, when the post 31 is inclined at an extremely large angle, a large force is applied to it to break it and furthermore the snap pieces 32, thus impairing the function of the snap portion 30. However, the outer surfaces of the impact abutting portions 38 as the lower half of the snap portion 30 abut with impact against the inner edge of the through hole 3, and the abutting portions 37 as its upper half abut against the upper surface of the chassis 2. Thus, any further inclination of the post 31 is prevented, and the post 31 and snap pieces 32 can be prevented from being broken.

Figure 9:
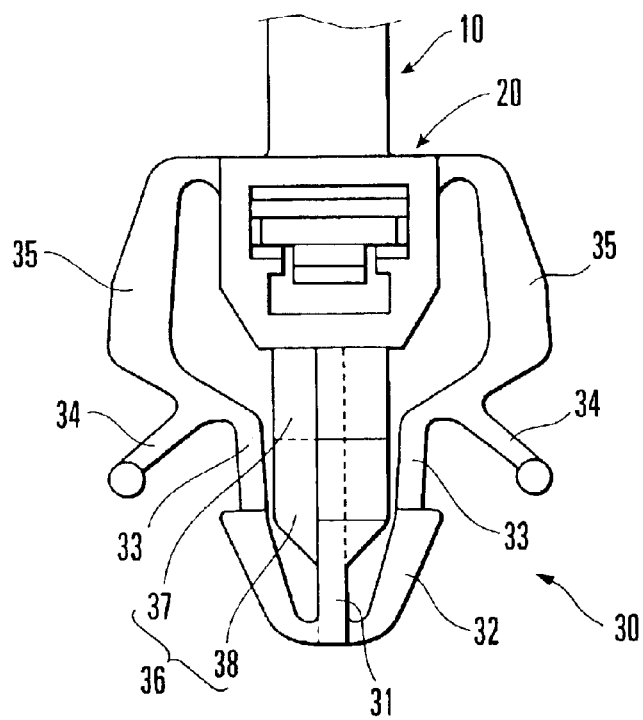
FIG. 9 is a front view showing the second embodiment of the present invention.

Embodiments in which the snap portion according to the present invention is modified will be described. In the embodiments, portions that are equivalent to those of the first embodiment are denoted by the same reference numerals. FIG. 9 shows the second embodiment. In the second embodiment, the upper ends of connecting pieces 33 are not connected to a locking portion 20 but are connected only to disengaging pieces 35.

In the second embodiment, as the connecting pieces 33 are not connected to the locking portion 20, the force necessary for reducing the snap pieces 32 in diameter is smaller than that of the first embodiment. Hence, the operation of inserting a snap portion 30 into the through hole of the chassis can be performed with a smaller force. This is advantageous in improving the workability. When the snap portion 30 built in the through hole of the chassis is to be inclined, the inclination is suppressed by the operation of stopper portions 36 in the same manner as in the first embodiment, and disengagement of the snap portion 30 is prevented.

Figure 10:
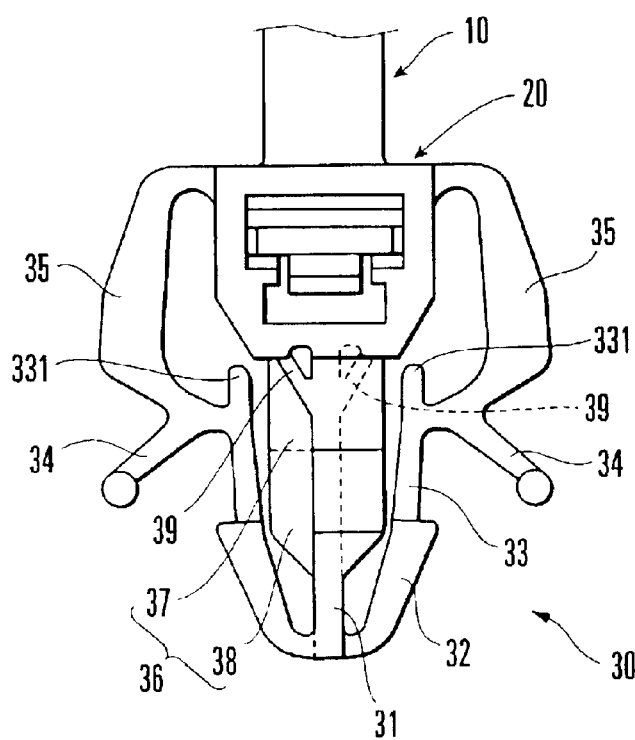
FIG. 10 is a front view showing the third embodiment of the present invention.

FIG. 10 shows the third embodiment. The third embodiment is characterized in that taper pieces 39 are integrally formed on the two surfaces of stopper portions 36 within their upper regions at the upper end of a post 31 such that their diameter increases gradually upward from the lower portion. To match this, connecting pieces 33 are not connected to a locking portion 20, and snap pieces 32 are connected to disengaging pieces 35 through the connecting pieces 33. This is the same as in the second embodiment. Note that upper ends 331 of the connecting pieces 33 project slightly upward to oppose the taper pieces 39.

In the third embodiment, as the connecting pieces 33 are not connected to the locking portion 20, the force necessary for reducing the snap pieces 32 in diameter is decreased. This is the same as in the second embodiment. Hence, the operation of inserting a snap portion 30 into the through hole of the chassis can be performed with a smaller force. This is advantageous in improving the workability. When the snap portion 30 built in the through hole of the chassis is to be inclined, the inclination is suppressed by the operation of the stopper portions 36 in the same manner as in the first and second embodiments, and disengagement of the snap portion 30 is prevented. At this time, when the snap pieces 32 are reduced in diameter to a certain degree, the upper ends 331 of the connecting pieces 33 abut against the taper pieces 39, to prohibit any further reduction in diameter of the snap pieces 32. Disengagement of the snap portion 30 can be prevented in this respect as well.

Figure 11:
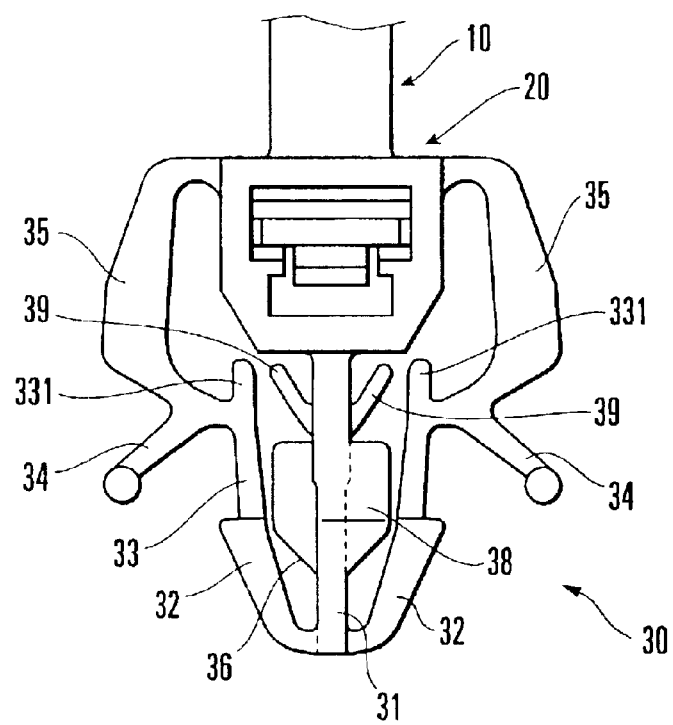
FIG. 11 is a front view showing the fourth embodiment of the present invention.

FIG. 11 shows the fourth embodiment. In the fourth embodiment, taper pieces 39 are integrally formed on the two surfaces of the upper end of a post 31 such that their diameter increases gradually upward from the lower portion. This is the same as in the third embodiment. In the fourth embodiment, the abutting portions 37 of the stopper portions 36 provided in the first embodiment are omitted. Connecting pieces 33 are not connected to a locking portion 20. Snap pieces 32 are connected to disengaging pieces 35 through the connecting pieces 33, and upper ends 331 of the connecting pieces 33 are arranged to oppose the taper pieces 39. This arrangement is the same as that of the third embodiment.

In the fourth embodiment, as the connecting pieces 33 are not connected to the locking portion 20, the force necessary for reducing the snap pieces 32 in diameter is decreased, and the operation of inserting a snap portion 30 into the through hole of the chassis can be performed with a smaller force. This is advantageous in improving the workability, which is the same as in the second and third embodiments. When the snap portion 30 built in the through hole of the chassis is to be inclined, the inclination is suppressed by the operation of impact abutting portions 38 of stopper portions 36, and disengagement of the snap portion 30 is prevented. As the stopper portions 36 have no abutting portions, the ability of inclination prevention is lower than those of the respective embodiments. Still, when the snap portion 30 is inclined at an angle larger than those of the respective embodiments, as the snap pieces 32 are reduced in diameter, the upper ends 331 of the connecting pieces 33 abut against the taper pieces 39, to prohibit any further reduction in diameter of the snap pieces 32. As a result, disengagement of the snap portion 30 from the through hole can be prevented.

Figure 12:
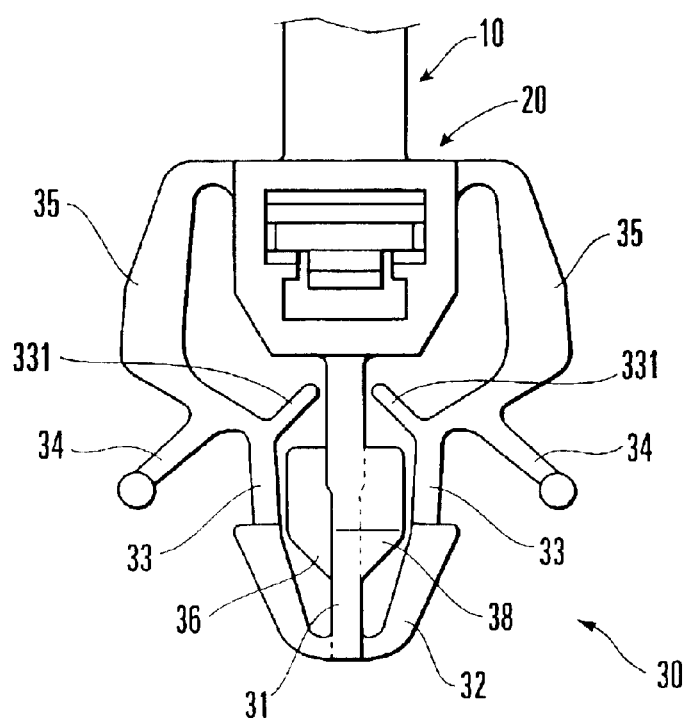
FIG. 12 is a front view showing the fifth embodiment of the present invention.

FIG. 12 shows the fifth embodiment. In the fifth embodiment, a post 31 has impact abutting portions 38 of stopper portions 36, in the same manner as in the fourth embodiment, while it does not have any taper pieces particularly. Upper ends 331 of connecting pieces 33 project toward the inner post 31 to incline slightly. This is the characteristic feature of the fifth embodiment.

In the fifth embodiment, as the connecting pieces 33 are not connected to a locking portion 20, the force necessary for reducing the snap pieces 32 in diameter is decreased, and the operation of inserting a snap portion 30 into the through hole of the chassis can be performed with a smaller force. This is advantageous in improving the workability, which is the same as in the second to fourth embodiments. When the snap portion 30 built in the through hole of the chassis is to be inclined, the inclination is suppressed by the operation of the impact abutting portions 38 of the stopper portions 36, and disengagement of the snap portion 30 is prevented. As the stopper portions 36 have no abutting portions, the ability of inclination prevention is lower than those of the first to fourth embodiments. Still, when the snap portion 30 is inclined at an angle larger than those of the first to fourth embodiments, as the snap pieces 32 are reduced in diameter, the upper ends 331 of the connecting pieces 33 respectively abut against the two outer surfaces of the post 31, to prohibit any further reduction in diameter of the snap pieces 32. As a result, disengagement of the snap portion 30 from the through hole can be prevented.

Figure 13:
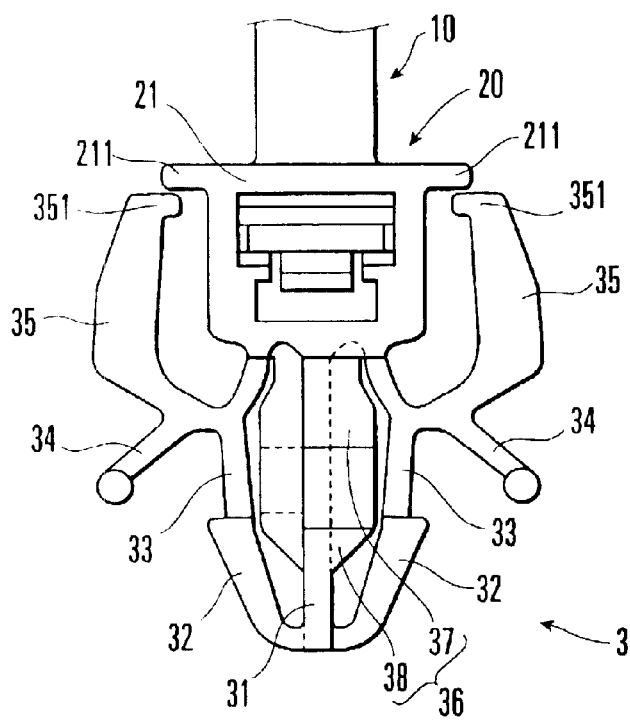
FIG. 13 is a front view showing the sixth embodiment of the present invention.

FIG. 13 shows the sixth embodiment. The sixth embodiment is characterized in that upper ends 351 of disengaging pieces 35 are separated from a locking portion 20. More specifically, the upper ends 351 of the disengaging pieces 35 are slightly bent inwardly, and are disposed below eaves 211 formed on the upper surface of a cylindrical portion 21 of the locking portion 20. Except for this, the arrangement of the sixth embodiment is completely the same as that of the first embodiment.

In the sixth embodiment, as the upper ends 351 of the disengaging pieces 35 are not connected to the locking portion 20, the disengaging pieces 35 can deform inwardly more easily. Hence, when disengaging a snap portion 30 from the through hole, the force necessary for deforming the disengaging pieces 35 inwardly by holding them with the fingers can be decreased, so that the snap portion 30 can be disengaged more easily. When the snap portion 30 built in the through hole of the chassis is to be inclined, the inclination is suppressed by the operation of stopper portions 36, and disengagement of the snap portion 30 is prevented. This is the same as in the first embodiment.

Figure 14:
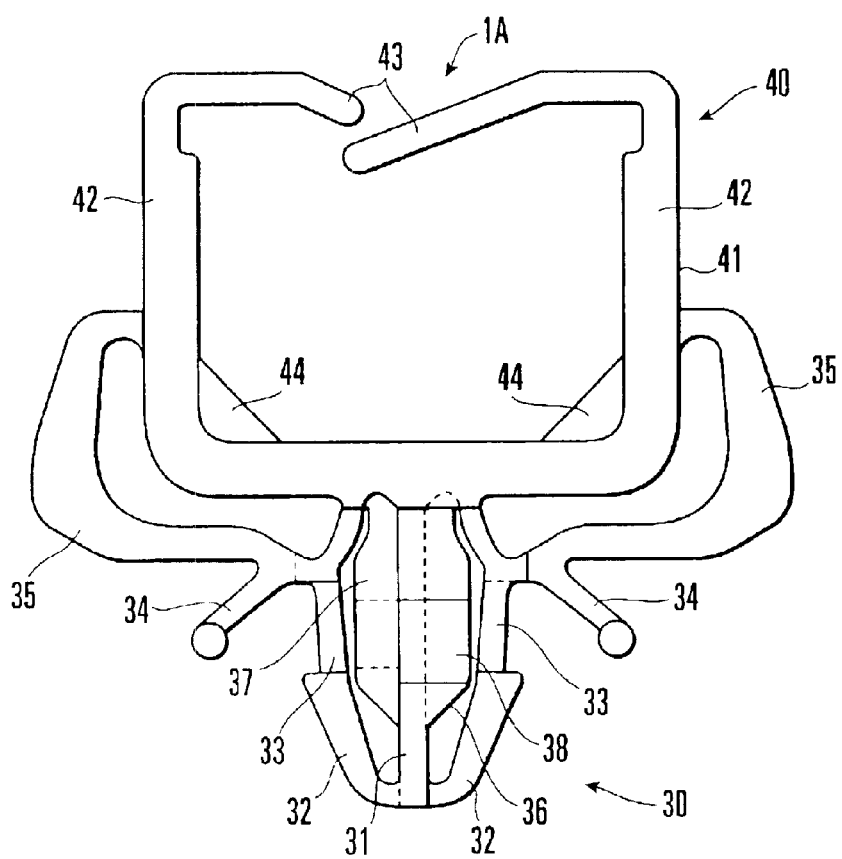
FIG. 14 is a front view of the seventh embodiment in which the present invention is applied to a wire saddle.

The snap structures of the present invention, that is, the structures of the snap portions of the respective embodiments, are not limited to the cable ties applied to the respective embodiments, but can be similarly applied to any component as far as it is a mount component to be attached to an opening formed in a chassis. For example, FIG. 14 shows the seventh embodiment in which the snap structure of the present invention is applied to a wire saddle. A wire saddle 1A serves to extend and support a wire or cable along a chassis. A saddle portion 40 is formed of an upward U-shaped main body 41 having two side pieces 42, and locking pieces 43 projecting slightly downwardly inward from the upper ends of the side pieces 42 of the main body 41 such that their distal ends overlap each other. When a wire is inserted in the main body 41 from between the locking pieces 43, removal of the wire is prevented by the locking pieces 43. In this embodiment, the two side pieces 42 of the main body 41 respectively have triangular ribs 44 for preventing inclination. A snap portion 30 similar to that of the first embodiment is formed on the bottom surface of the main body 41 of the wire saddle 1A. Disengaging pieces 35 of the snap portion 30 extend in a bulging manner from the bottom surface of the main body 41 to the outer sides of the two side pieces 42.

In the seventh embodiment, the wire saddle 1A can be attached to and disengaged from a through hole formed in the chassis in the same manner as in the first embodiment. In the seventh embodiment as well, as the wire saddle 1A attached to the through hole of the chassis is to be inclined, when it is inclined at only a small angle, the outer surfaces of impact abutting portions 38 of stopper portions 36 of a post 31 inevitably abut with impact against the inner edge of the through hole. Simultaneously, abutting portions 37 immediately above the impact abutting portions 38 abut against the upper surface of the chassis at the open edge of the through hole. The post 31 is prohibited from inclining any further, and snap pieces 32 are prevented from being reduced in diameter, so that the snap portion 30 is prevented from disengaging from the through hole. When the disengaging pieces 35 are held from the two sides, the ribs 44 formed in the main body 41 prevent the two side pieces 42 from inclining inwardly.

Figure 15:
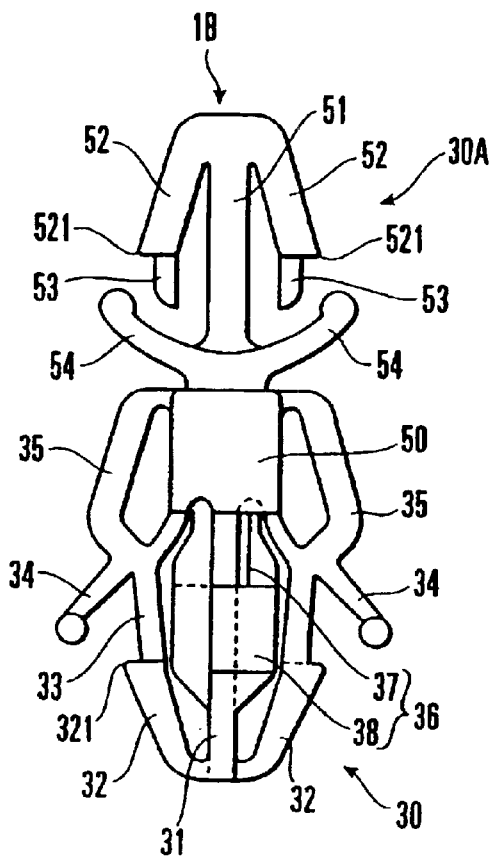
FIG. 15 is a front view of the eighth embodiment in which the present invention is applied to a board support.
Figure 17:
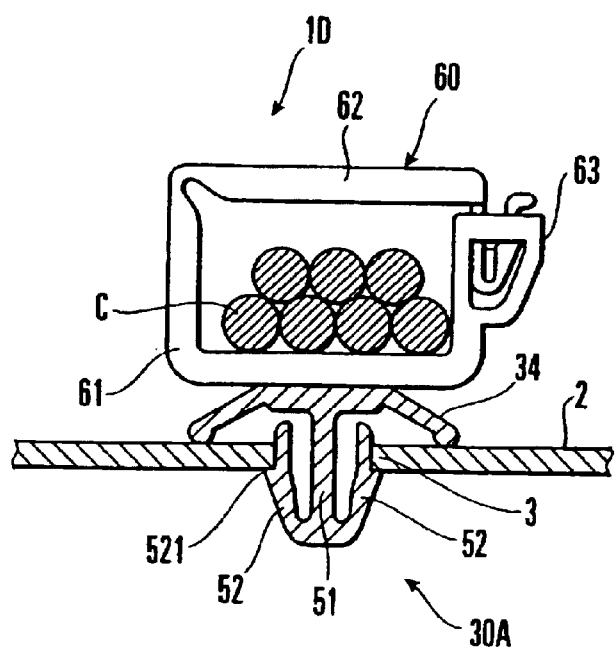
FIG. 17 is a front view of a conventional cable clamp.

FIG. 15 shows the eighth embodiment in which the snap structure of the present invention is applied to a board support 1B. The board support 1B extends and supports a board such as a printed circuit board along the surface of a chassis. An upper end-side snap portion 30A of the board support 1B is fitted in a through hole formed in the board from the lower surface of the board, and a lower end-side snap portion 30 of the board support 1B is fitted in the through hole of the chassis from the upper surface, so that the board is supported on the chassis. In this embodiment, the conventional snap structure shown in FIG. 17 is employed as the upper end-side snap portion 30A, and the snap structure of the present invention is employed as the lower end-side snap portion 30. More specifically, a post 51, a pair of snap pieces 52, projecting pieces 53 for forming steps 521 at the ends of the snap pieces 52, and a pair of leg pieces 54 are formed at the upper end of a short cylindrical main shaft 50, thus constituting the upper end-side snap portion 30A. A post 31, pair of snap pieces 32, pair of connecting pieces 33, pair of leg pieces 34, and pair of disengaging pieces 35 are formed at the lower end of the main shaft 50. Stopper portions 36 respectively including abutting portions 37 and impact abutting portions 38 are formed on the post 31 in the same manner as in the first embodiment. The snap structure of the present invention is thus constituted.

In the eighth embodiment, regarding the lower end-side snap portion 30 of the board support 1B, the snap portion 30 can be attached to and disengaged from the through hole formed in the chassis in the same manner as in the first embodiment. In this case as well, as the board support 1B attached to the through hole of the chassis is to be inclined, when it is inclined at only a small angle, the outer surfaces of the impact abutting portions 38 of the stopper portions 36 of the post 31 inevitably abut with impact against the inner edge of the through hole. Simultaneously, the abutting portions 37 immediately above the impact abutting portions 38 abut against the upper surface of the chassis at the open edge of the through hole. The board support 1B is prohibited from inclining any further, and the snap pieces 32 are prevented from deforming inwardly, so that the snap portion 30 is prevented from disengaging from the through hole.

Figure 16:
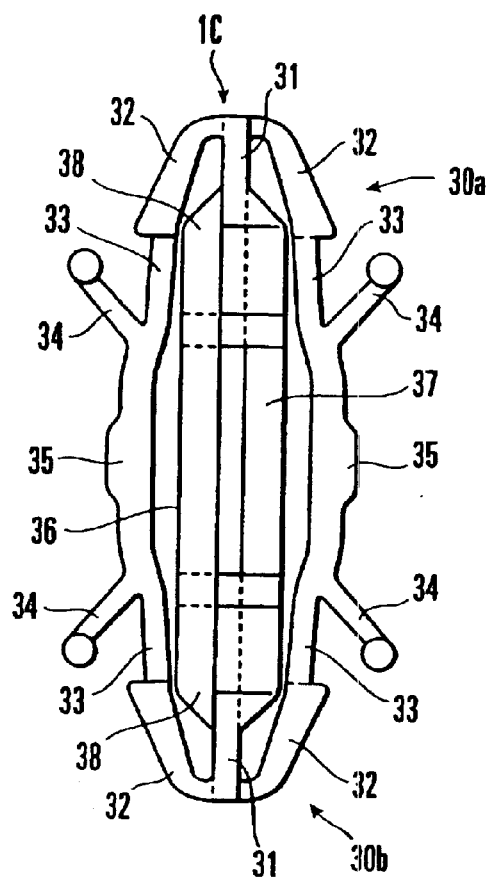
FIG. 16 is a front view of the ninth embodiment in which the present invention is applied to a board support.

FIG. 16 shows the ninth embodiment in which the snap structure of the present invention is applied to a board support 1C. In the ninth embodiment, the snap structure of the present invention is applied to both an upper end-side snap portion 30a and lower end-side snap portion 30b. More specifically, a post 31 extends straightly from its upper end to lower end, and a pair of snap pieces 32 are formed on each of the upper and lower ends. The two pairs of snap pieces 32 are connected to each other by a pair of connecting pieces 33. A pair of leg pieces 34 are formed on the respective connecting pieces 33 at each of the upper and lower ends. The connecting pieces 33 of the upper and lower snap portions 30a and 30b are connected to each other by disengaging pieces 35. The post 31 is formed as a stopper portion 36 almost throughout the entire length from its upper end to lower end. The intermediate region of the stopper portion 36 is formed as an abutting portion 37, and its upper and lower end regions are formed as impact abutting portions 38, respectively.

In the ninth embodiment, the upper end-side snap portion 30a of the board support 1C can be attached in a fitted state to and removed from a through hole formed in a board (not shown), and the lower end-side snap portion 30b of the board support 1C can be attached in a fitted state to and removed from a through hole formed in a chassis (not shown). Thus, the board can be fixed to and supported on the chassis by the board support 1C. In this embodiment as well, as the board support 1C is to be inclined with respect to the chassis or board, when it is inclined at only a small angle, the outer surface of the abutting portion 37 of the stopper portion 36 of the post 31 inevitably abuts with impact against the inner edge of the through hole of the board or chassis. Simultaneously, the abutting portion 37 abuts against the surface of the board or chassis at the open edge of the through hole. The board support 1C is prohibited from inclining any further, and the snap pieces 32 are prevented from deforming inwardly, so that the snap portions 30a and 30b are prevented from disengaging from the through hole.

The present invention has been described on the basis of the various types of embodiments, but the snap structure according to the present invention is not limited to the arrangements described in the respective embodiments. Particularly, the connecting pieces of the respective embodiments can be formed integrally with and as part of the disengaging pieces, as is apparent from the eighth embodiment. The snap structure of the present invention can be applied to any arrangement which is to be attached to a through hole formed in a chassis or the like, by appropriately and partly changing it to match the arrangement. For example, the snap structure of the present invention can be apparently applied to the cable clamp shown in FIG. 17.

As has been described above, according to the snap structure according to the present invention which has disengaging pieces for disengaging, from the surface of the board, snap pieces that are fitted in the through hole, a post having the snap pieces is provided with a stopper portion which prohibits the post from being inclined at a predetermined angle or more. While the snap structure is fitted in the through hole of the board, when the post is to be inclined, the stopper portion abuts with impact against the inner edge of the through hole or the upper surface of the board at the open edge of the through hole. As the stopper portion abuts against the through hole or chassis, the post is prohibited from inclining any further, and reduction in diameter of the snap pieces is prevented, so that disengagement of the snap portion can be prevented. Hence, the operation of attaching and disengaging a mount component to and from a through hole of a board can be performed easily. This facilitates the operation of disassembling the printed board or wiring lines of an electrical appliance from the chassis or panel as a solution to the environmental issues. The attached mount component will not disengage from the board easily. Thus, various types of electronic devices with improved parts mounting reliability can be obtained.

What is claimed is:

1. A snap structure including:
   a post;
   arrowhead-shaved snap pieces formed at a distal end of said post and elastically deformable in a radial direction;
   leg pieces arranged to oppose said snap pieces; and
   disengaging pieces which are connected each to one end of corresponding one of said snap pieces that are enlarged in diameter and which are capable of reducing in diameter said snap pieces manually,
   said snap pieces serving to deform elastically in the radial direction, upon insertion in a through hole formed in a chassis, to be fitted in the through hole, so as to clamp the chassis together with said leg pieces,
   characterized in that said post comprises a stopper portion for prohibiting said post from being inclined in the through hole at not less than a predetermined angle;

wherein said stopper portion comprises an impact abutting portion which abuts with impact against an inner edge of the through hole (3) when said post is inclined at the predetermined angle, and an abutting portion which abuts against a surface of the chassis when said post is to be inclined at not less than the predetermined angle.

2. A structure according to claim 1, wherein said post is formed as a plate with a width smaller than a diameter of the through hole, said stopper portion is formed to project in opposite directions on two sides in a radial direction of said post, said impact abutting portion is formed in a region in a longitudinal direction of said post which is to enter and be positioned in the through hole when said snap pieces are fitted in the through hole, and said abutting portion is formed in a region outer than the through hole on an insertion side.

\* \* \* \* \*